US011735449B2

(12) United States Patent
Onuki et al.

(10) Patent No.: US 11,735,449 B2
(45) Date of Patent: Aug. 22, 2023

(54) SUBSTRATE STORAGE CONTAINER

(71) Applicant: Shin-Etsu Polymer Co., Ltd., Tokyo (JP)

(72) Inventors: Kazumasa Onuki, Niigata (JP); Hiroshi Mimura, Saitama (JP); Junya Toda, Saitama (JP); Takashi Suda, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 172 days.

(21) Appl. No.: 16/763,990

(22) PCT Filed: Oct. 1, 2018

(86) PCT No.: PCT/JP2018/036714
§ 371 (c)(1),
(2) Date: May 14, 2020

(87) PCT Pub. No.: WO2019/097862
PCT Pub. Date: May 23, 2019

(65) Prior Publication Data
US 2020/0286761 A1 Sep. 10, 2020

(30) Foreign Application Priority Data

Nov. 16, 2017 (JP) .................. 2017-221126

(51) Int. Cl.
*H01L 21/673* (2006.01)
*B65D 85/30* (2006.01)
*H01L 21/68* (2006.01)

(52) U.S. Cl.
CPC ........ *H01L 21/67383* (2013.01); *B65D 85/30* (2013.01); *H01L 21/6732* (2013.01);
(Continued)

(58) Field of Classification Search
CPC .......... H01L 21/67383; H01L 21/6732; H01L 21/67346; H01L 21/67369; H01L 21/67386; H01L 21/68; B65D 85/30
(Continued)

(56) References Cited

U.S. PATENT DOCUMENTS 6,206,197 B1* 3/2001 Decamps ............ H01L 21/6732
206/454
6,267,245 B1* 7/2001 Bores ................ H01L 21/67369
206/711
(Continued)

FOREIGN PATENT DOCUMENTS

JP 2004304122 10/2004
JP 2011060994 3/2011
(Continued)

OTHER PUBLICATIONS

"International Search Report (Form PCT/ISA/210) of PCT/JP2018/036714," dated Dec. 18, 2018, with English translation thereof, pp. 1-4.

*Primary Examiner* — Chun Hoi Cheung
(74) *Attorney, Agent, or Firm* — JCIP Global Inc.

(57) ABSTRACT

A substrate storage container includes a container main body having an opening at the front, a support portion for supporting a substrate in the interior thereof, and a substrate receiving portion positioned more toward a rear wall than the support portion, an a lid on which a substrate pressing portion for pressing the substrate is formed. The substrate receiving portion and the substrate pressing portion are present within a range of greater than or equal to 0 mm and less than or equal to 80 mm in the horizontal direction from a vertical center line that passes through the center of the container main body when the lid is viewed from the front.

6 Claims, 10 Drawing Sheets

(52) U.S. Cl.
CPC .. *H01L 21/67346* (2013.01); *H01L 21/67369* (2013.01); *H01L 21/67386* (2013.01); *H01L 21/68* (2013.01)

(58) Field of Classification Search
USPC ................................ 206/710, 711, 712, 832
See application file for complete search history.

(56) References Cited

U.S. PATENT DOCUMENTS

| | | | | |
|---|---|---|---|---|
| 8,318,275 | B2* | 11/2012 | Kudo | H01L 21/67383 |
| | | | | 428/35.7 |
| 8,356,713 | B2* | 1/2013 | Ogawa | H01L 21/67369 |
| | | | | 206/711 |
| 8,464,872 | B2* | 6/2013 | Inoue | H01L 21/67383 |
| | | | | 206/711 |
| 8,910,792 | B2* | 12/2014 | Nagashima | H01L 21/67383 |
| | | | | 206/711 |
| 10,217,655 | B2* | 2/2019 | Mushel | H01L 21/67383 |
| 10,559,484 | B2* | 2/2020 | Kato | H01L 21/67369 |
| 2005/0247594 | A1* | 11/2005 | Mimura | H01L 21/67369 |
| | | | | 206/710 |
| 2006/0283774 | A1* | 12/2006 | Hasegawa | H01L 21/67369 |
| | | | | 206/725 |
| 2007/0295638 | A1* | 12/2007 | Nakatogawa | H01L 21/67383 |
| | | | | 206/711 |
| 2011/0215028 | A1 | 9/2011 | Igarashi et al. | |
| 2013/0037444 | A1 | 2/2013 | Inoue | |
| 2013/0056388 | A1 | 3/2013 | Nagashima | |
| 2014/0197068 | A1* | 7/2014 | Cho | H01L 21/67383 |
| | | | | 206/711 |
| 2015/0294882 | A1 | 10/2015 | Matsutori et al. | |
| 2017/0294327 | A1 | 10/2017 | Gregerson et al. | |
| 2018/0068882 | A1* | 3/2018 | Kato | H01L 21/67359 |
| 2018/0182655 | A1* | 6/2018 | Yokoyama | H01L 21/67383 |

FOREIGN PATENT DOCUMENTS

| | | |
|---|---|---|
| JP | 2011253960 | 12/2011 |
| JP | 2017527997 | 9/2017 |
| WO | 2011052998 | 5/2011 |
| WO | 2011132257 | 10/2011 |
| WO | 2011148450 | 12/2011 |
| WO | 2014080454 | 5/2014 |

* cited by examiner

SUBSTRATE STORAGE CONTAINER

CROSS-REFERENCE TO RELATED APPLICATION

This application is a 371 application of the International PCT application serial no. PCT/JP2018/036714 filed on Oct. 1, 2018, which claims the priority benefits of Japan Patent Application No. 2017-221126, filed on Nov. 16, 2017. The entirety of each of the above-mentioned patent applications is hereby incorporated by reference herein and made a part of this specification.

TECHNICAL FIELD

The present invention is related to a substrate storage container that stores a plurality of substrates.

DESCRIPTION OF RELATED ART

Substrate storage containers store substrates such as semiconductor wafers in an internal space, and are utilized to store the substrates in a warehouse, during conveyance among semiconductor processing apparatuses, for transport among factories, etc. For this reason, substrate storage containers protect the stored substrate from vibrations, impact, and the like during transport.

As such a substrate storage container, a substrate storage container which has an opening in the front of a container main body, a lid for closing the opening, support portions and substrate receiving portions for supporting substrates provided on both side surfaces of the container main body, and a substrate pressing portion provided on the lid, in which when the lid is attached to the container main body, substrates are sandwiched between the substrate pressing portion and the substrate receiving portions, and the substrates are supported by being lifted from the support portion is known (refer to Patent Document 1, for example).

RELATED ART

Patent Document

Patent Document 1: Japanese Unexamined Patent Publication No. 2004-304122

SUMMARY

Problems to be Solved

However, in these substrate storage containers, the substrate receiving portions for guiding the substrate in the vertical direction are provided on both side surfaces of the container main body, and the pressing force from the substrate pressing portion which is provided on the lid is obliquely dispersed. Therefore, a large pressing force had been required because the pressure cannot be efficiently applied to the substrate receiving portion.

The present invention has been developed in view of the above problem. It is an objective of the present invention to provide a substrate storage container which is capable of efficiently applying pressure from a substrate pressing portion to a substrate receiving portion when a lid is attached to a container main body and substrates are supported by being is lifted from support portions and supported.

Means for Solving the Problems (1) One aspect of the present invention is a substrate storage container which is equipped with a container main body having an opening at a front side, a support portion for supporting a substrate in the interior thereof, a substrate receiving portion located more toward the side of a rear wall side than the support portion, and a lid having a pressing member with a substrate pressing portion for pressing the substrate, the substrate storage container supporting the substrate by lifting the substrate from the support portion with the substrate pressing portion and the substrate receiving portion when the lid is attached to the container main body, and supporting the substrate with the support portion when the lid is removed from the container main body, the substrate receiving portion and the substrate pressing portion being present within a range of greater than or equal to 0 mm and less than or equal to 80 mm in the horizontal direction from a vertical center line that passes through the center of the container main body when the lid is viewed from the front. Note that a position corresponding to the center of the substrate when the substrate is stored in the substrate storage container is designated as the center of the container main body.

(2) Another aspect of the present invention is a substrate storage container which is equipped with a container main body having an opening on a front side, a support portion for supporting a substrate in the interior thereof, and a substrate receiving portion located more toward the side of a rear wall side than the support portion, and a lid having a pressing member formed with a substrate pressing portion for pressing the substrate, the substrate storage container supporting the substrate by lifting the substrate from the support portion with the substrate pressing portion and the substrate receiving portion when the lid is attached to the container main body, and supporting the substrate with the support portion when the lid is removed from the container main body, the substrate receiving portion and the substrate pressing portion being present at positions at which a reaction force component in a direction of a normal line at a contact portion with the substrate against a pressing force that operates on the contact portion of the substrate in a front-rear direction is greater than a reaction force component in a tangential direction at the contact portion. Note that a direction that connects the lid and the rear wall of the container main body is designated as the front-rear direction.

(3) In the aspect of (1) or (2) above, the substrate pressing portion may be present within a range of greater than or equal to 0° and less than or equal to 30° in the horizontal direction from the center of the container main body when the lid is viewed from the front.

(4) In any one of the aspects of (1) through (3) above, the substrate receiving portion may be present within a range of greater than or equal to 20° and less than or equal to 30° in the horizontal direction from the center of the container main body when the rear wall is viewed from the front.

(5) In any one of the aspects of (1) through (4) above, the substrate may have a diameter of 300 mm.

Effects

According to the present invention, a substrate storage container which is capable of efficiently applying a pressing force from a substrate pressing portion to a substrate receiving portion when a lid is attached to a container main body and a substrate is supported by being lifted from a support portion can be provided.

DESCRIPTION OF THE EMBODIMENTS

Figure 1:
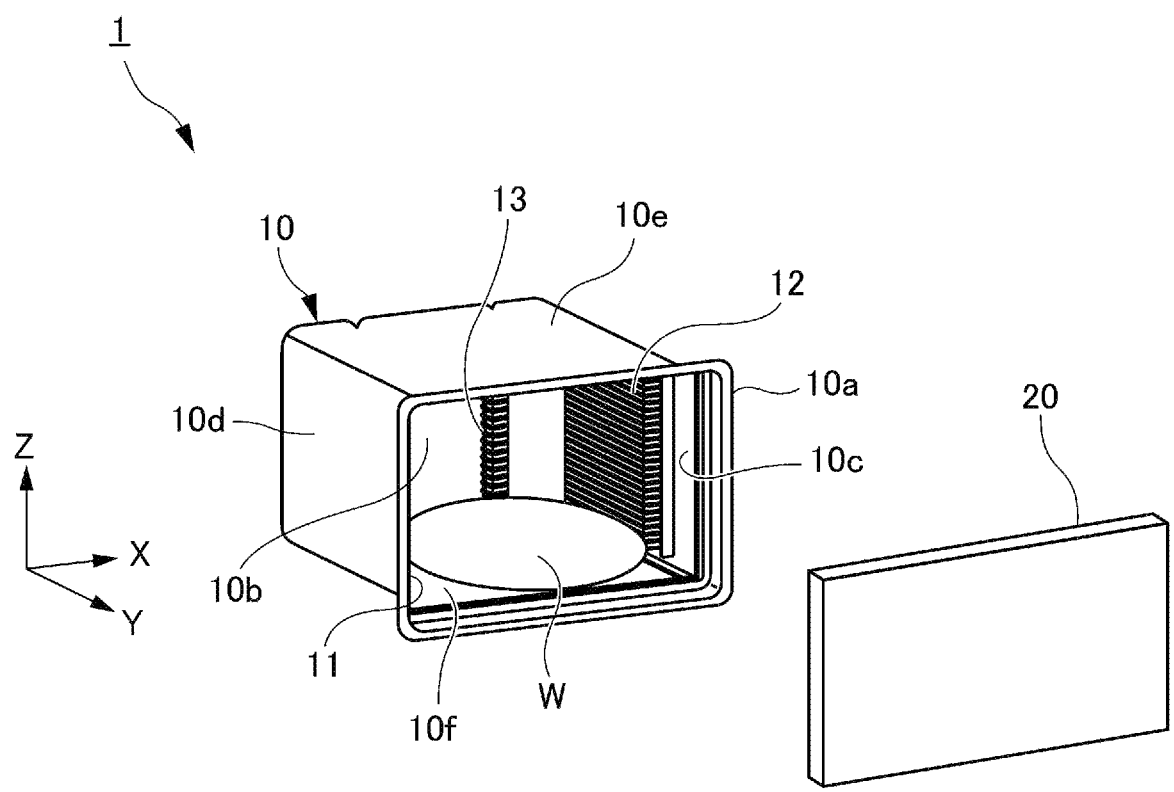
FIG. 1 is an exploded schematic perspective view that illustrates a substrate storage container according to a first embodiment.

Hereinafter, embodiments of the present invention will be described in detail with reference to the attached drawings. Throughout the description of the embodiments in the present specification, the same members are denoted by the same reference numerals and symbols.

First Embodiment

Figure 2A:
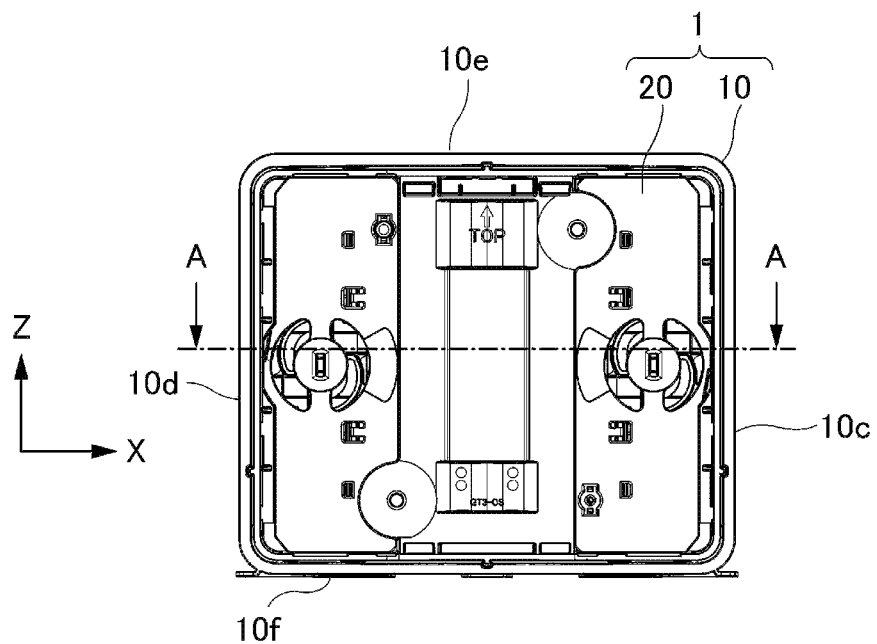
FIG. 2A is a front view that illustrate the substrate storage container when a lid is attached.
Figure 2B:
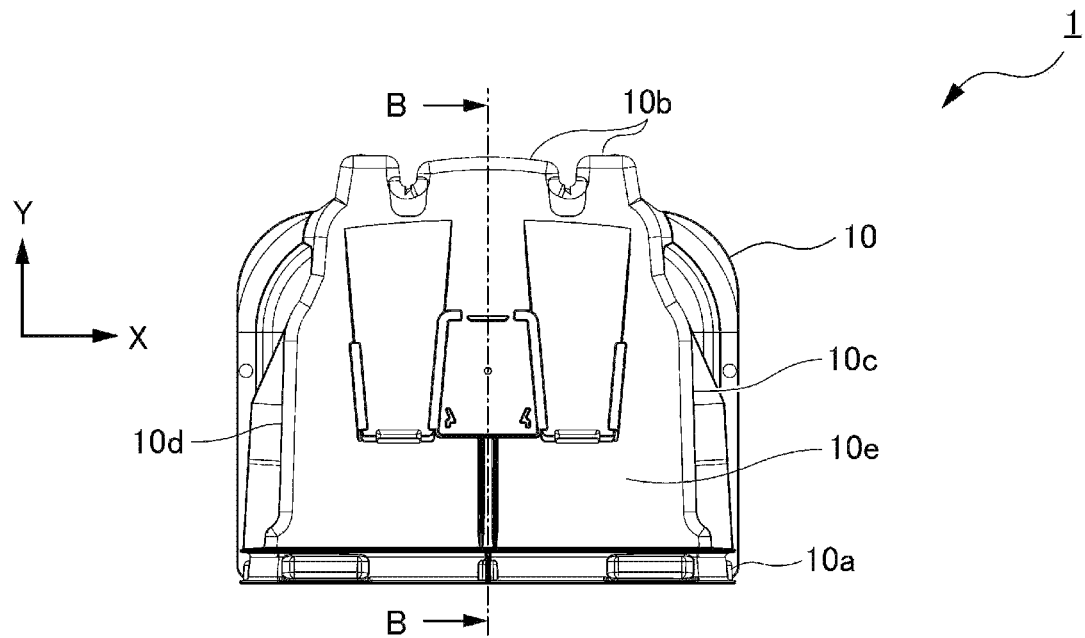
FIG. 2B is a plan view that illustrate the substrate storage container when the lid is attached.
Figure 2C:
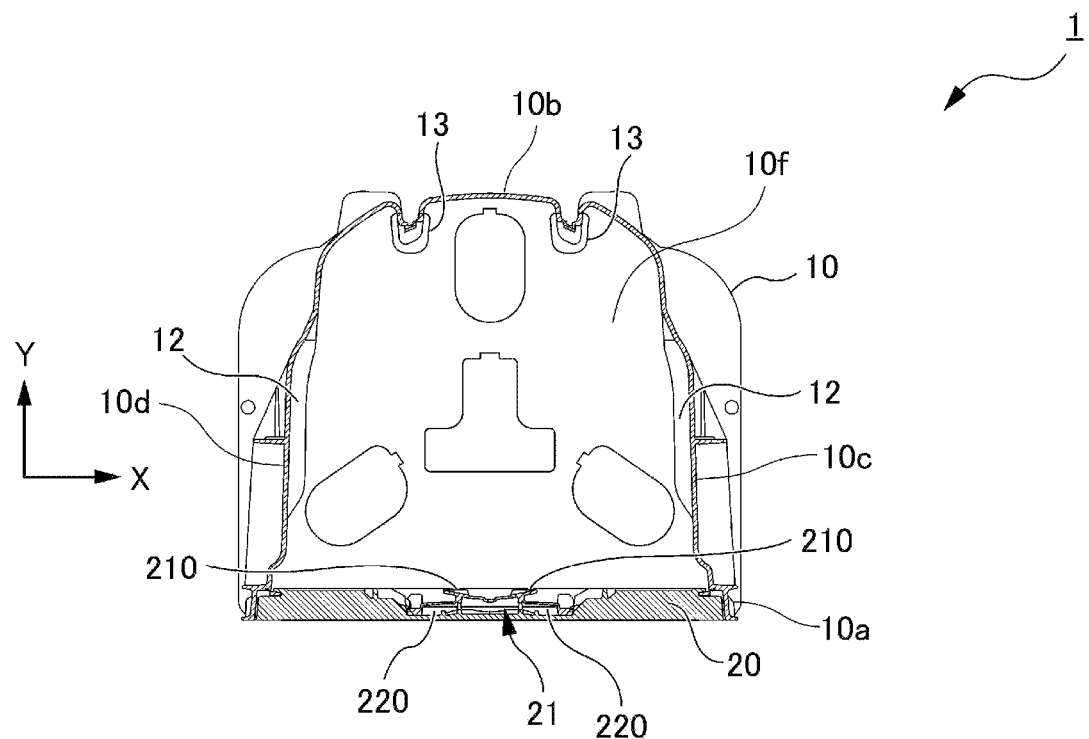
FIG. 2C is a cross sectional view taken along line A-A that illustrate the substrate storage container when the lid is attached.
Figure 2D:
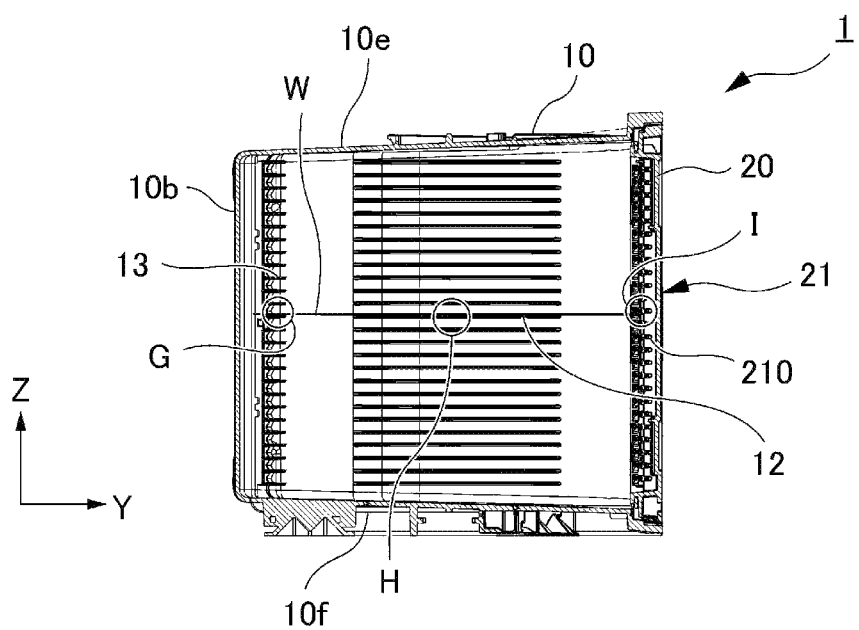
FIG. 2D is a cross sectional view taken along line B-B that illustrate the substrate storage container when the lid is attached.
Figure 2E:
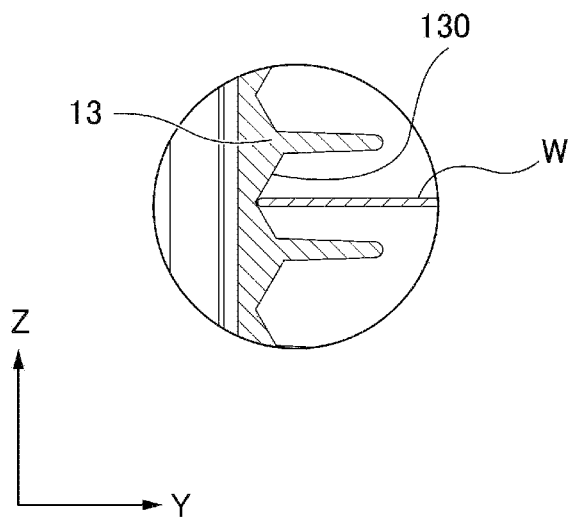
FIG. 2E is a magnified cross sectional view of portion G that illustrate the substrate storage container when the lid is attached.
Figure 2F:
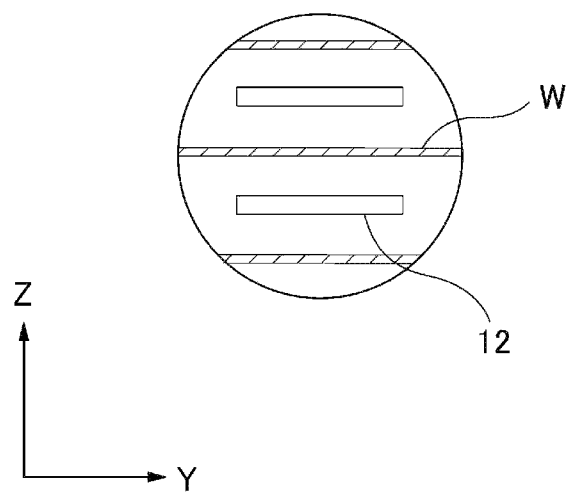
FIG. 2F is a magnified cross sectional view of portion H that illustrate the substrate storage container when the lid is attached.
Figure 2G:
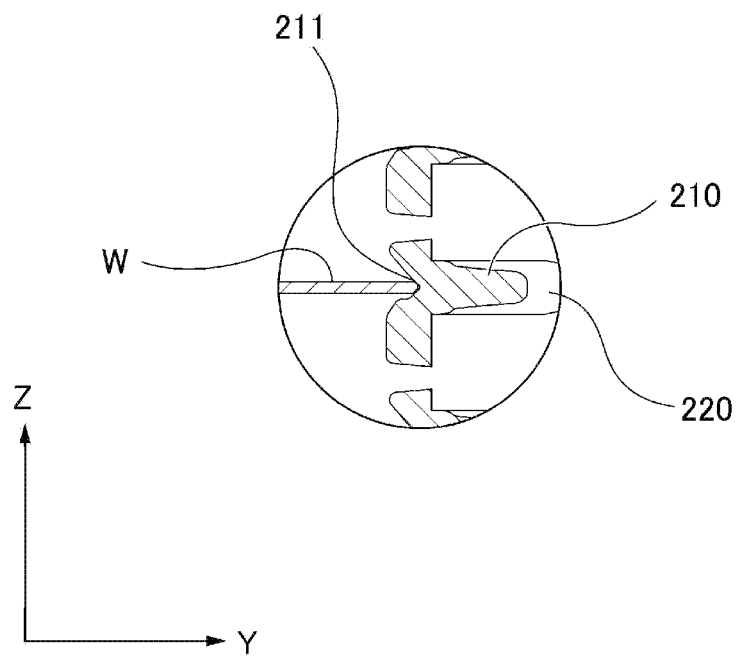
FIG. 2G is a magnified cross sectional view of portion I that illustrate the substrate storage container when the lid is attached.

First, a substrate storage container 1 will be described. FIG. 1 is an exploded schematic perspective view that illustrates the substrate storage container 1. FIG. 2A is a front view that illustrates the substrate storage container when a lid is attached. FIG. 2B is a plan view that illustrates the substrate storage container when the lid is attached. FIG. 2C is a cross sectional view taken along line A-A that illustrate the substrate storage container when the lid is attached. FIG. 2D is a cross sectional view taken along line B-B that illustrates the substrate storage container when the lid is attached. FIG. 2E is a magnified cross sectional view of portion G that illustrates the substrate storage container when the lid is attached. FIG. 2F is a magnified cross sectional view of portion H that illustrates the substrate storage container when the lid is attached. FIG. 2G is a magnified cross sectional view of portion I that illustrates the substrate storage container when the lid is attached. In FIG. 1, the horizontal direction is designated as an X axis direction, the vertical direction is designated as a Z axis direction, and a front-rear direction that connects the lid 20 and a rear wall 10b is designated as a Y axis direction when the substrate storage container 1 in which a surface of a substrate W is housed in the horizontal direction is viewed from side toward the lid 20 side. The X axis, the Y axis, and the Z axis are also illustrated in the subsequent drawings as necessary.

The substrate storage container 1 which is illustrated in FIG. 1 stores a plurality of substrates W, and is equipped with a container main body 10 and a lid 20. The substrates W which are stored in the substrate storage container 1 are semiconductor wafers or mask glass having a diameter of 300 mm, for example, but are not limited thereto.

The container main body 10 is of a box-like shape that includes an opening frame 10a that forms a front opening 11, a rear wall 10b, a right wall 10c, a left wall 10d, a top wall 10e, and a bottom wall 10f. The container main body 10 is that of a so called front open type.

A pair of support portions 12 that support the substrates W and a pair of substrate receiving portions 13 are formed in the container main body 10. Although not illustrated in FIG. 1, the other of the pairs of the support portions 12 and the substrate receiving portions 13 are formed at symmetric positions.

The support portions 12 are formed at two positions on the interior sides of the right wall 10c and the left wall 10d so as to face each other (refer to FIG. 2C). The support portions 12 are configured by so called groove teeth, and are formed of a plurality of grooves which are formed in a height direction (refer to FIG. 2D). The substrates W are inserted and stored in each respective groove.

The substrate receiving portions 13 are formed side by side at two positions on the rear wall 10b (refer to FIG. 2C), and are located more toward the rear wall 10b than the support portions 12 (refer to FIG. 2D). The substrate receiving portions 13 are also provided with a plurality of grooves that correspond to the number of grooves which are formed in the support portions 12.

Meanwhile, the lid 20 closes the opening 11 of the container main body 10 and forms an internal space of the substrate storage container 1. In addition, a packing material (not illustrated) is arranged between the container main body 10 and the lid 20. The packing material secures the airtightness of the substrate storage container 1 when the lid 20 is attached to the container main body 10, and is capable of reducing entry of dust, moisture, etc. into the substrate storage container 1 from the exterior.

The lid 20 has a pressing member 21, and substrate pressing portions 210 that press the substrates W are formed on the pressing member 21 (refer to FIG. 2C). The pressing member 21 is provided at the center in the X axis direction at the interior side of the lid 20.

The substrate pressing portions 210 are formed at two positions along the X axis direction, and press and support the substrates W at these two positions. The substrate pressing portions 210 are formed as arms 220 which have the elasticity of the pressing member 21, that contact and press the substrates W by the elasticity of the arms 220. Note that a plurality of substrate pressing portions 210 are formed in the vertical direction according to the number of substrates W which are capable of being stored.

Examples of the material of the container main body 10 and the lid 20 include thermoplastic resins such as polycarbonate, cycloolefin polymer, polyether imide, polyether ketone, polyether ether ketone, polybutylene terephthalate, polyacetal, liquid crystal polymer, and alloys thereof.

The same material as that of the container main body 10 may be employed as the material of the support portions 12. Alternatively, in order to improve the sliding properties of the substrates W, an amorphous resin such as cyclic olefin polymer may be employed.

The same material as that of the container main body 10 may be employed as the material of the substrate receiving portions 13. Alternatively, in order to improve the sliding properties of the substrates W, an amorphous resin such as cyclic olefin polymer may be employed.

The same material as that of the lid 20 may be employed as the material of the pressing member 21. Alternatively, a thermoplastic resin such as polycarbonate or an alloy of polycarbonate and polybutylene terephthalate may be used to improve abrasion properties with respect to the substrates W. Additionally an additive may be added to improve sliding properties.

Figure 3A:
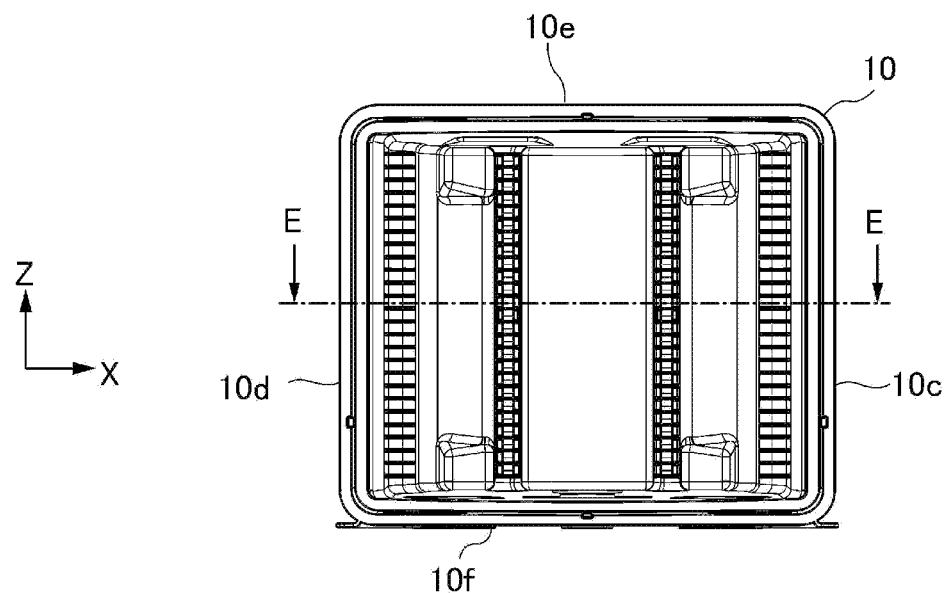
FIG. 3A is a front view that illustrates a container main body when the lid is removed.
Figure 3B:
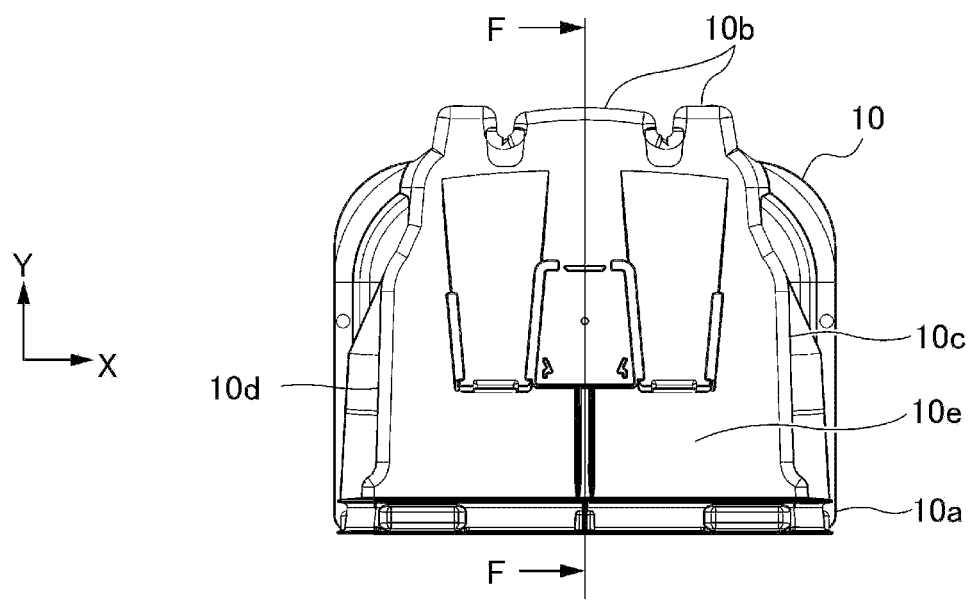
FIG. 3B is a plan view that illustrates the container main body when the lid is removed.
Figure 3C:
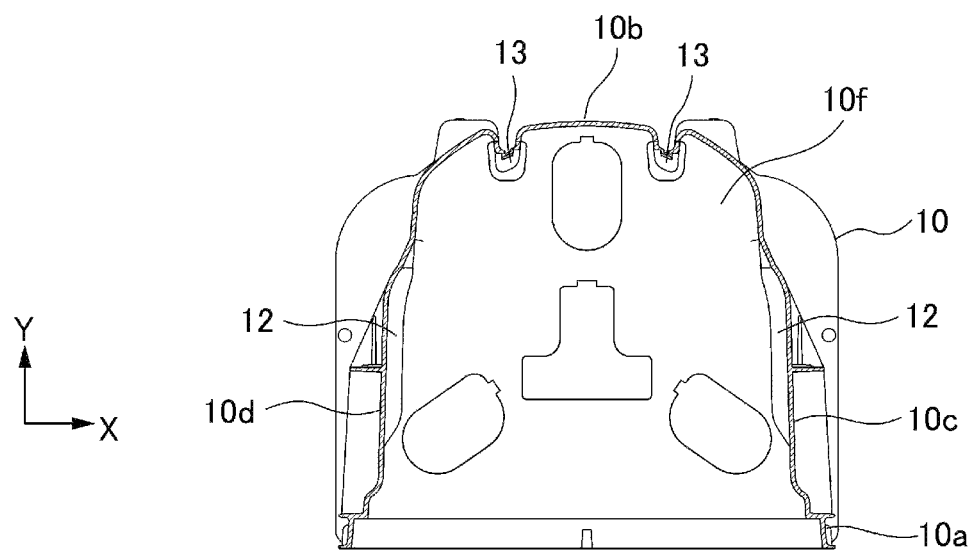
FIG. 3C is a cross sectional view taken along line E-E that illustrates the container main body when the lid is removed.
Figure 3D:
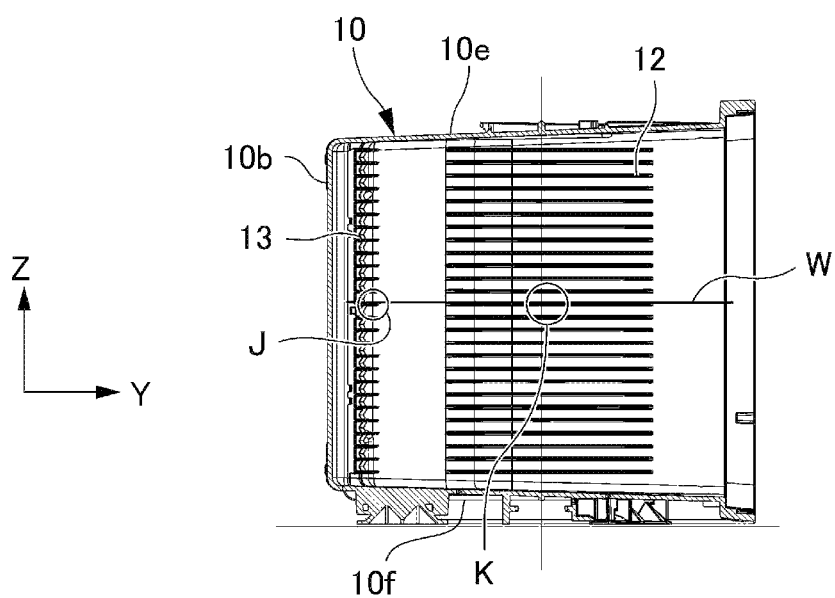
FIG. 3D is a cross sectional view taken along line F-F that illustrates the container main body when the lid is attached.
Figure 3E:
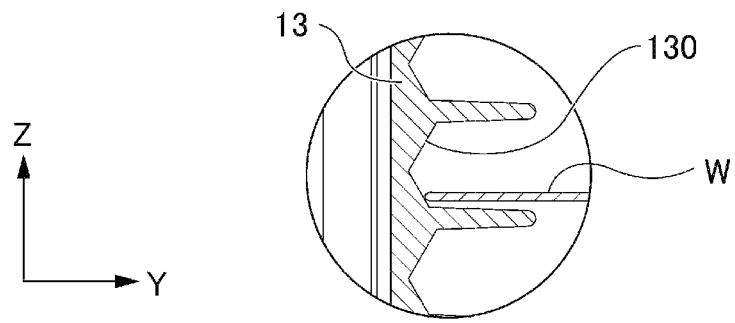
FIG. 3E is a magnified cross sectional view of portion J that illustrates the container main body when the lid is attached.
Figure 3F:
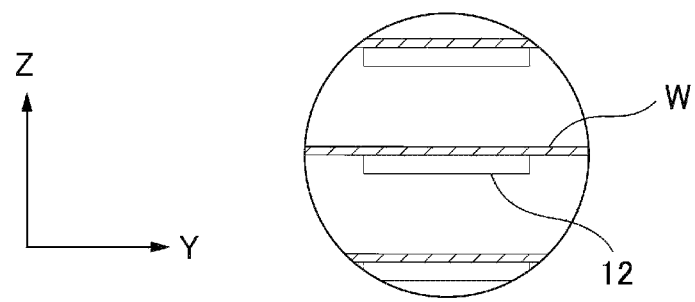
FIG. 3F is a magnified cross sectional view of portion K that illustrate the container main body when the lid is attached.

Here, a state in which a substrate W is stored in the container main body 10 when the lid 20 is removed from the container main body 10 and a state in which the substrate W is stored in the container main body 10 when the lid 20 is attached to the container main body 10 will be described. FIG. 3A is a front view that illustrates the container main body when a lid is removed. FIG. 3B is a plan view that illustrates the container main body when the lid is removed. FIG. 3C is a cross sectional view taken along line E-E that illustrates the container main body when the lid is removed. FIG. 3D is a cross sectional view taken along line F-F that illustrate the container main body when the lid is attached. FIG. 3E is a magnified cross sectional view of portion J that illustrates the container main body when the lid is attached. FIG. 3F is a magnified cross sectional view of portion K that illustrates the container main body when the lid is attached.

In the case that the substrate W is to be stored in the container main body 10, the substrate W is inserted from the opening 11 on the front surface of the container main body 10 into opposing grooves of the pair of support portions 12 at the same height, and is stored in a state in which only the pair of left and right support portions 12 support the substrate W such that the surface of the substrate W is horizontal (refer to FIG. 3F). In the state in which the substrate W is supported only by the support portions 12, the support portions 12 are provided with an inclined stepped portion (not illustrated) such that the side of the substrate W toward the rear wall 10b does not contact the substrate receiving portions 13 (beneath the V-shaped groove 130 formed therein).

When the lid 20 is attached to the container main body 10 from a state in which the substrate W is supported only by the support portions 12, the substrate W is sandwiched between the substrate pressing portions 210 and the substrate receiving portions 13, and the substrate W is lifted from the support portion 12 and is supported by the substrate pressing portions 210 and the substrate receiving portions 13 (refer to FIG. 2D-2G).

In greater detail, a V shaped groove 211 is formed in each of the substrate pressing portions 210 (refer to FIG. 2G), and when the lid 20 is attached to the container main body 10, the front side of the substrate W is fitted into the V shaped grooves 211 of the substrate pressing portions 210. Thereafter, when the substrate W is pushed toward the rear side by the substrate pressing portion 210, the substrate receiving portions 13 move the substrate W from the state which is illustrated in FIG. 3E to the state which is illustrated in FIG. 2E by the substrate W sliding along the V shaped grooves 130, and the substrate W reaches the bottom toward the rear side of the V-shaped grooves 130.

The substrate W which is stored in the substrate storage container in this manner is supported by the substrate receiving portions 13 and the substrate pressing portions 210 while being lifted from the support portion 12. When the lid 20 is removed from the container main body 10, the substrate W is supported only by the support portions 12.

Figure 4:
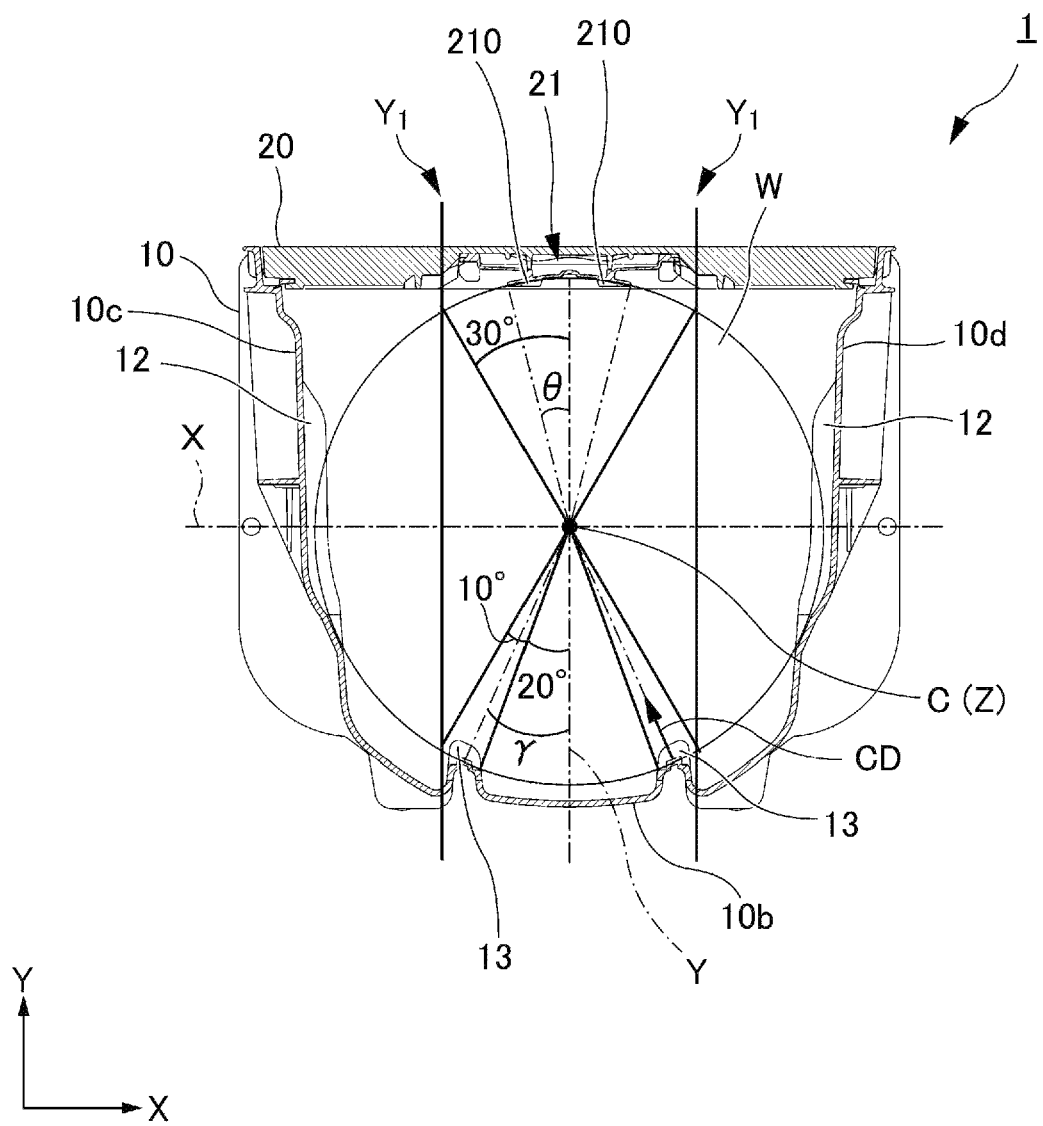
FIG. 4 is a cross sectional diagram in the horizontal direction that illustrates a state in which a substrate is supported within the substrate storage container.

Next, the positional relationship between the substrate receiving portions 13 and the substrate pressing portions 210 will be described. FIG. 4 is a horizontal cross sectional view that illustrates a state in which a substrate W is supported in the substrate storage container 1.

In FIG. 4, the substrate receiving portions 13 and the substrate pressing portions 210 are arranged at positions facing each other.

Specifically, the substrate receiving portions 13 are present at least within a range of greater than or equal to 0 mm and less than or equal to 80 mm in the horizontal direction from a vertical (Z axis direction) center line Z that passes through the center C of the container main body 10 when the lid 20 is viewed from the front. Note that the center C of the container main body 10 is a position corresponding to the center of the substrate W when the substrate W is stored in the substrate storage container 1. In addition, a center line X, a center line Y, and a center line Z are designated as those that pass through the center C of the container main body 10.

In other words, the substrate receiving portions 13 are present at least within a range of greater than or equal to 0 mm and less than or equal to 80 mm in the horizontal direction from the center line Y in the front-rear direction (Y-axis direction) that passes through the center C of the container main body 10. Note that in FIG. 4, a position 80 mm away from the center line Y is indicated by a line segment Y1.

Further, the substrate receiving portions 13 are present within a range of greater than or equal to 20° and less than or equal to 30° in the horizontal direction from the center C of the container main body 10 when the rear wall 10b is viewed from the front. That is, an angle γ which is formed by a line segment that connects (the center of) the substrate receiving portions 13 and the center C of the container main body 10, and the center line Y that passes through the center C of the container main body in the front-rear direction (Y axis direction) is within a range of greater than or equal to ±20° and less than or equal to ±30° with respect to the center line Y.

Meanwhile, in a manner similar to the substrate receiving portions 13, the substrate pressing portions 210 are also present at least within a range of greater than or equal to 0 mm and less than or equal to 80 mm in the vertical direction from the center line Z in the vertical direction (Z axis direction) that passes through the center C of the container main body 10 when the lid 20 is viewed from the front.

Further, the substrate pressing portions 210 are present within a range of greater than or equal to 0° and less than or equal to 30°, and preferably a range of greater than or equal to 0° and less than or equal to 21° in the horizontal direction from the center C of the container main body 10 when the lid 20 is viewed from the front. In other words, an angle θ which is formed by a line segment that connects (the center of) the substrate receiving portions 13 and the center C of the container main body 10, and the center line Y that passes through the center C of the container main body in the front-rear direction (Y axis direction) is within a range of less than or equal to ±30° and preferably less than or equal to ±21° with respect to the center line Y. Note that if the angle θ exceeds 30°, the molding properties of the substrate pressing portions 210 will deteriorate, and it will not be possible to press the substrates W uniformly.

According to the substrate storage container 1 of the first embodiment, when the lid 20 is attached to the container main body 10 and the substrate W is supported by being lifted from the support portions 12, the pressing force from the substrate pressing portions 210 operates mainly toward the center direction of the substrate W at the substrate receiving portions 13. Therefore, the substrate storage container 1 which is capable of efficiently applying the pressing force from the substrate pressing portions 210 to the substrate receiving portions 13 can be provided. In addition, by lifting and separating the substrate W from the support portions 12, it is possible to suppress transmission of vibrations, impact, etc. from the support portions 12 to the substrate W during transport.

Second Embodiment

Figure 5:
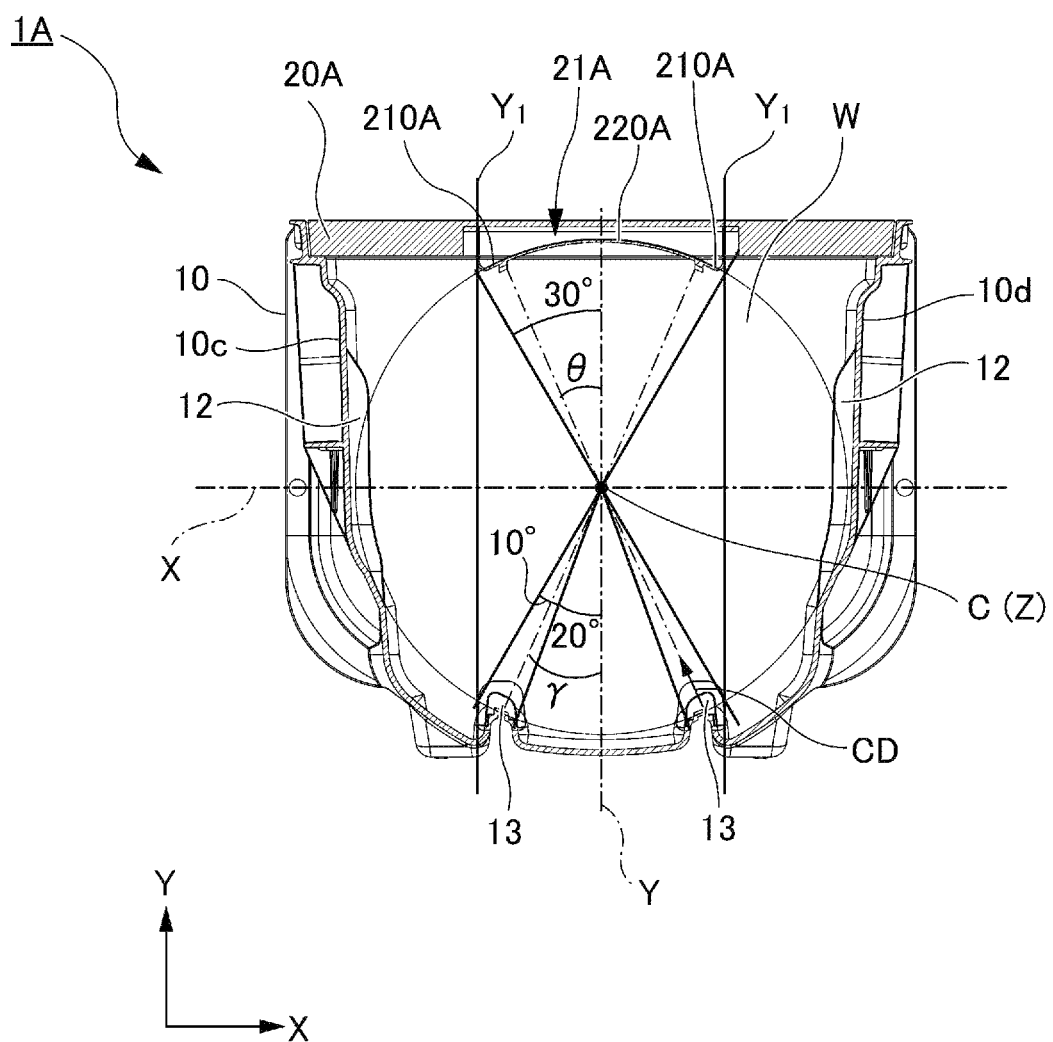
FIG. 5 is a cross sectional diagram in the horizontal direction that illustrates a state in which a substrate is supported within a substrate storage container according to a second embodiment.

FIG. 5 is a cross sectional diagram in the horizontal direction that illustrates a state in which a substrate W is supported within a substrate storage container 1A according to a second embodiment.

In the substrate storage container 1A of the second embodiment, the shapes of a lid 20A, a pressing member 21A, substrate pressing portions 210A, and arms 220A are different from those of the first embodiment, and the other components are the same as those of the first embodiment.

Specifically, the distance between the two substrate pressing portions 210A is longer than that in the first embodiment, and the substrate pressing portions 210A are formed at both ends of the arch shaped arms 220A. In addition, the substrate pressing portions 210A protrude toward the container main body 10 from the surface of the lid 20A.

In this case as well, the substrate pressing portions 210A are present at least within a range of greater than or equal to 0 mm and less than or equal to 80 mm in the horizontal direction from a vertical (Z axis direction) center line Z that passes through the center C of the container main body 10 when the lid 20 is viewed from the front, in the same manner as the substrate pressing portions 210. Further, the substrate pressing portions 210A are present within a range of greater than or equal to 0°, and less than or equal to 30° in the horizontal direction from the center C of the container main body 10 when the lid 20A is viewed from the front.

Note that this substrate storage container 1A is utilized when a human operator, not a transfer device such as a robot, manually performs attachment or detachment of the lid 20A or insertion or removal of the substrate W.

Preferred embodiments of the present invention have been described in detail above. However, the present invention is not limited to the above embodiments, and various modifications and changes are possible within the scope of the present invention as recited in the claims.

(Modification)

In the embodiments which were described above, the positions of the substrate receiving portions 13 and the substrate pressing portions 210 and 210A are defined by specific dimensions and angles. Alternatively, these positions may be defined by the pressing force (or reaction force) that operates on the substrate W. For example, in the case that it is presumed that the pressing force for pressing the substrate W which is generated when the lid 20 is attached to the container main body 10 is applied in a direction along the Y axis direction, the substrate receiving portions 13 may be present at positions at which a reaction force component CD that presses the substrate W back in a normal direction at the substrate receiving portions (the contact portions thereof with the substrate W) is greater than the reaction force component in the tangential direction of the contact portions, and preferably greater than or equal to 0.43 times greater than the pressing force (in the case where the force is received at two positions in the horizontal direction). In addition, the same may apply to the positions of the substrate pressing portions 210 and 210A. If the reaction force component CD that pushes back the substrate W in the normal direction at substrate receiving portions 13 is greater than the reaction force component in the tangential direction in this manner, the substrate W will not rotate if the pressing force of the substrate W is applied.

In each of the above embodiments, the support portions 12 and the substrate receiving portions 13 may be formed integrally with the container main body 10, or may be mounted in the container main body 10 as separate components.

In each of the above embodiments, the inclination of the V shaped grooves 130 which are formed in the substrate receiving portions 13 and the inclination of the V shaped grooves 211 which are formed in the substrate pressing portions 210 and 210A are not limited to those which are illustrated in the drawings. These inclinations may be changed according to the sliding properties of the substrate W with respect to the materials which are employed for the substrate pressing portions 210 and 210A, and the pressing force which is applied by the substrate pressing portions 210 and 210A to the substrate W.

DESCRIPTIONS OF REFERENCE NUMERALS 1, 1A Substrate storage container
10 Container Main Body
10a Opening Frame
10b Rear Wall
10c Right Wall
10d Left Wall
10e Top Wall
10f Bottom Wall
11 Opening
12 Support Portion
13 Substrate Receiving Portion
20, 20a Lid
21, 21a Pressing Member
210, 210a Substrate Pressing Portion
W Substrate
CD Reaction Force Component that presses substrate back in normal direction

What is claimed is:

1. A substrate storage container, comprising:
a container main body having an opening at a front side, a support portion for supporting a substrate in the interior thereof, a plurality of substrate receiving portions located more toward the side of a rear wall side than the support portion; and
a lid having a pressing member with a plurality of substrate pressing portions for pressing the substrate;
the substrate storage container supporting the substrate by lifting the substrate from the support portion with the plurality of substrate pressing portions and the plurality of substrate receiving portions when the lid is attached to the container main body, and supporting the substrate with the support portion when the lid is removed from the container main body;

the plurality of substrate pressing portions being present within a range of greater than 0 mm and less than or equal to 80 mm in the horizontal direction from a vertical center line that passes through the center of the container main body when the lid is viewed from the front; and a position corresponding to the center of the substrate when the substrate is stored in the substrate storage container being designated as the center of the container main body, wherein the plurality of the substrate receiving portions are located horizontally symmetrically with respect to the vertical center line within a range of greater than or equal to 20° and less than or equal to 30° in the horizontal direction from the center of the container main body when the rear wall is viewed from the front, wherein the pressing member comprises an arch shape arm extending the horizontal direction and a pair of elastic arms supporting the arch shape arm at both end portions of the arch shape arm, the pressing member supported only from both ends thereof, and wherein the plurality of substrate pressing portions consists of a pair of substrate pressing portions located symmetrically in the both end portions of the arch shape arm.

2. The substrate storage container as defined in claim 1, wherein:

each of the plurality of substrate pressing portions extends backward from the end portion of the arch shape arm and is present within a range of greater than 0° and less than or equal to 30° in the horizontal direction from the center of the container main body when the lid is viewed from the front.

3. The substrate storage container as defined in claim 1, wherein:

the substrate has a diameter of 300 mm.

4. The substrate storage container as defined in claim 1, wherein:

the plurality of substrate pressing portions are present within a range of greater than 0° and less than or equal to 21° in the horizontal direction from the center of the container main body when the lid is viewed from the front.

5. The substrate storage container as defined in claim 1, wherein the plurality of substrate pressing portions are located opposite to the corresponding plurality of substrate receiving portions along a front-rear direction that connects the lid and the rear wall of the container main body.

6. The substrate storage container as defined in claim 1, wherein the pressing member consists of:

an arch shape portion entirely extending along an outward convex arch on a horizontal plane;

vertically extending portions, each vertically extending from an end portion of the arch shape portion toward the lid; and outward extending portions, each extending from the end of the corresponding vertically extending portion outward of the arch shape portion along the lid, wherein each substrate pressing portion is located in the end portion of the arch shape portion.

* * * * *